United States Patent [19]
Van de Plassche

[11] Patent Number: 5,510,736
[45] Date of Patent: Apr. 23, 1996

[54] DIFFERENTIAL SAMPLER CIRCUIT

[75] Inventor: Rudy Van de Plassche, Waalre, Netherlands

[73] Assignee: U.S. Philips Corporation, New York, N.Y.

[21] Appl. No.: 278,364

[22] Filed: Jul. 21, 1994

[30] Foreign Application Priority Data

Jul. 22, 1993 [FR] France .................. 93 09054

[51] Int. Cl.⁶ .................................................. G11C 27/02
[52] U.S. Cl. .................. 327/91; 327/74; 327/96
[58] Field of Search ............................. 327/91, 93, 94, 327/95, 74, 88, 89, 90

[56] References Cited

U.S. PATENT DOCUMENTS

| 4,982,119 | 1/1991 | Tateishi | 327/96 |
| 5,017,924 | 5/1991 | Guiberteau et al. | 342/195 |
| 5,039,880 | 8/1991 | Astegher et al. | 327/96 |
| 5,130,572 | 7/1992 | Stitt et al. | 327/96 |
| 5,298,801 | 3/1994 | Vorenkamp et al. | 327/91 |
| 5,349,305 | 9/1994 | Hsiao et al. | 327/96 |

FOREIGN PATENT DOCUMENTS 0446880   3/1991   European Pat. Off. .

OTHER PUBLICATIONS

Vorenkamp et al., "Fully Bipolar, 120-Msamples/s 10-b Track-and-Hold Circuit", IEEE Journal of Solid-State Circuits, vol. 27, No. 7, Jul. 1992, pp. 988–992.

Primary Examiner—Timothy P. Callahan
Assistant Examiner—My-Trang Nu Ton
Attorney, Agent, or Firm—Laurie E. Gathman

[57] ABSTRACT

The subject of the invention is a differential sampler circuit including a voltage/current converter (1) having two differential inputs (E1a, E1b) and two outputs (S1a, S1b). According to the invention, each of these outputs is linked via an input multiplexer module (2a) to two interposed track-and-hold modules (5a, 6a), in such a way that at any instant one of the track-and-hold modules (5a, 6a) operates in track mode whereas the other (6a, 5a) operates in hold mode. These two modules (5a, 6a) are linked to the output (S4a) of the sampler circuit via an output multiplexer module (7a). This structure makes it possible to double the sampling frequency without increasing the intrinsic speed of the circuit. Each track-and-hold module (5a, 6a) includes an input load (10a, 11a) linked in parallel with a capacitor (C18a, C19a), an output emitter-follower transistor (T20a, T21a), and a switching cell (5-6a). Thus, the high-frequency performance of the circuit is improved.

13 Claims, 2 Drawing Sheets

DIFFERENTIAL SAMPLER CIRCUIT

BACKGROUND OF THE INVENTION

The subject of the present invention is a differential sampler circuit having two differential inputs and two outputs and including a voltage/current converter whose inputs are those of the sampler circuit and which has two outputs.

In the field of digital signal processing, and especially for digital television receivers, it is necessary to employ analog/digital converters whose sampling frequencies may attain 2 to 3 GHz.

In order to produce a sampler circuit, it is known to use a differential track-and-hold module such as described in the article by Messrs Vorenkamp and Verdaasdonk entitled "Fully bipolar, 120M sample/s 10-b track-and-hold circuits" published in the journal "IEEE Journal of solid-state circuits" n° 7, of the month of July 1992. This module includes a switching cell composed of a transistor which, during the period of tracking of the input signal behaves as an emitter-follower so as to charge a recording capacitor, and which is reverse-biased during the holding period so as to retain as an output the signal which was recorded during the tracking period. The use of such an emitter-follower transistor as a switch gives rise to high-frequency oscillations. Moreover, this circuit exhibits a tracking period and then a holding period such that no conversion can take place during the tracking period. The performance of such a circuit is therefore limited in frequency.

SUMMARY OF THE INVENTION

The purpose of the present invention is to propose a sampler circuit which remedies these drawbacks by enabling tracking and holding at the same time.

To do this, a sampler circuit according to the invention and such as defined in the introductory paragraph is characterized in that one of the outputs of the voltage/current converter is linked via an input multiplexer module controlled by a first clock signal to the inputs of a first and of a second track-and-hold modules whose outputs are linked to one of the outputs of the sampler circuit via an output multiplexer module controlled by a second clock signal, in such a way that:

for a first level of the first and second clock signals, the first track-and-hold module operates in track mode whereas the second operates in hold mode, for a second level of the first and second clock signals, the first track-and-hold module operates in hold mode whereas the second operates in track mode, and the other output of the voltage/current converter is coupled to the other output of the sampler circuit via an input multiplexer module, via two track-and-hold modules and via an output multiplexer module which are configured correspondingly and controlled by the same clock signals.

The use, for each part of the differential circuit, of two interposed track-and-hold modules makes it possible, at any instant, to have a signal at the output of the sampler circuit and hence to double the sampling speed without increasing the intrinsic speed of the circuit. This sampler circuit moreover exhibits the advantage of sharing the necessary resources between the two track-and-hold modules: in particular, it includes just a single read stage (consisting of the voltage/current converter); and on the other hand, the same current source makes it possible alternately to provide current to an element of the first track-and-hold module and then to the corresponding element of the second track-and-hold module.

Moreover, in a sampler circuit according to the invention, the first and second track-and-hold modules each advantageously include:

an input load comprising a first transistor whose collector is connected to a supply voltage terminal via a first resistor, whose base is connected to the collector via a second resistor and whose emitter constitutes the input of the track-and-hold module, a capacitor connected by a first terminal to the supply voltage terminal and by a second terminal to the input of the track-and-hold module, an output stage including at least one second emitter-follower transistor whose base is linked to the second terminal of the capacitor, and they also include a switching cell, common to both track-and-hold modules, comprising a first differential transistor pair which is controlled by the first clock signal, and which includes a third and a fourth transistors connected respectively by their collector to the bases of the first transistors of the first and of the second track-and-hold modules, in such a way that:

when the first clock signal is at its first level, the fourth transistor of the first differential transistor pair is the one which is active, and that when the first clock signal is at its second level, the third transistor of the first differential transistor pair is the one which is active.

Thus, the use of an emitter-follower transistor as a switch is avoided. Indeed, the switching cell makes it possible, depending on the level of the first clock signal controlling the first differential pairs of transistors, to reverse-bias the first transistor of the input load of the first or of the second track-and-hold module, so that it operates in hold mode. The performance of the sampler circuit at high frequencies is therefore improved.

In a preferred embodiment of a sampler circuit according to the invention, each of the output multiplexer modules comprises a second differential transistor pair, controlled by the second clock signal, and which itself makes it possible to control a third differential transistor pair, the transistors of the second and third pairs being linked by a collector-base link, the emitters of the transistors of the third pair constituting the output of the sampler circuit, their collectors being linked to the supply voltage terminal, and their bases being connected respectively to the emitters of the second transistors of the first and second track-and-hold modules via a third and a fourth resistor.

This output multiplexing makes it possible to select the active output.

In another embodiment of a sampler circuit according to the invention, each of the input multiplexer modules comprises a fourth differential transistor pair controlled by the first clock signal and whose transistors are connected respectively by their collector to the inputs of the first and second track-and-hold modules.

This input multiplexing determines the exact instant of the sampling which is independent of the level of the input signal. This is a further advantage as compared with the circuit described in the aforesaid prior art.

BRIEF DESCRIPTION OF THE DRAWINGS

Other features, details and advantages of the present invention will be made clear by the description which follows in connection with the attached drawings which relate to examples given without limitation and in which.

BRIEF DESCRIPTION OF THE PREFERRED EMBODIMENTS

Figure 1:
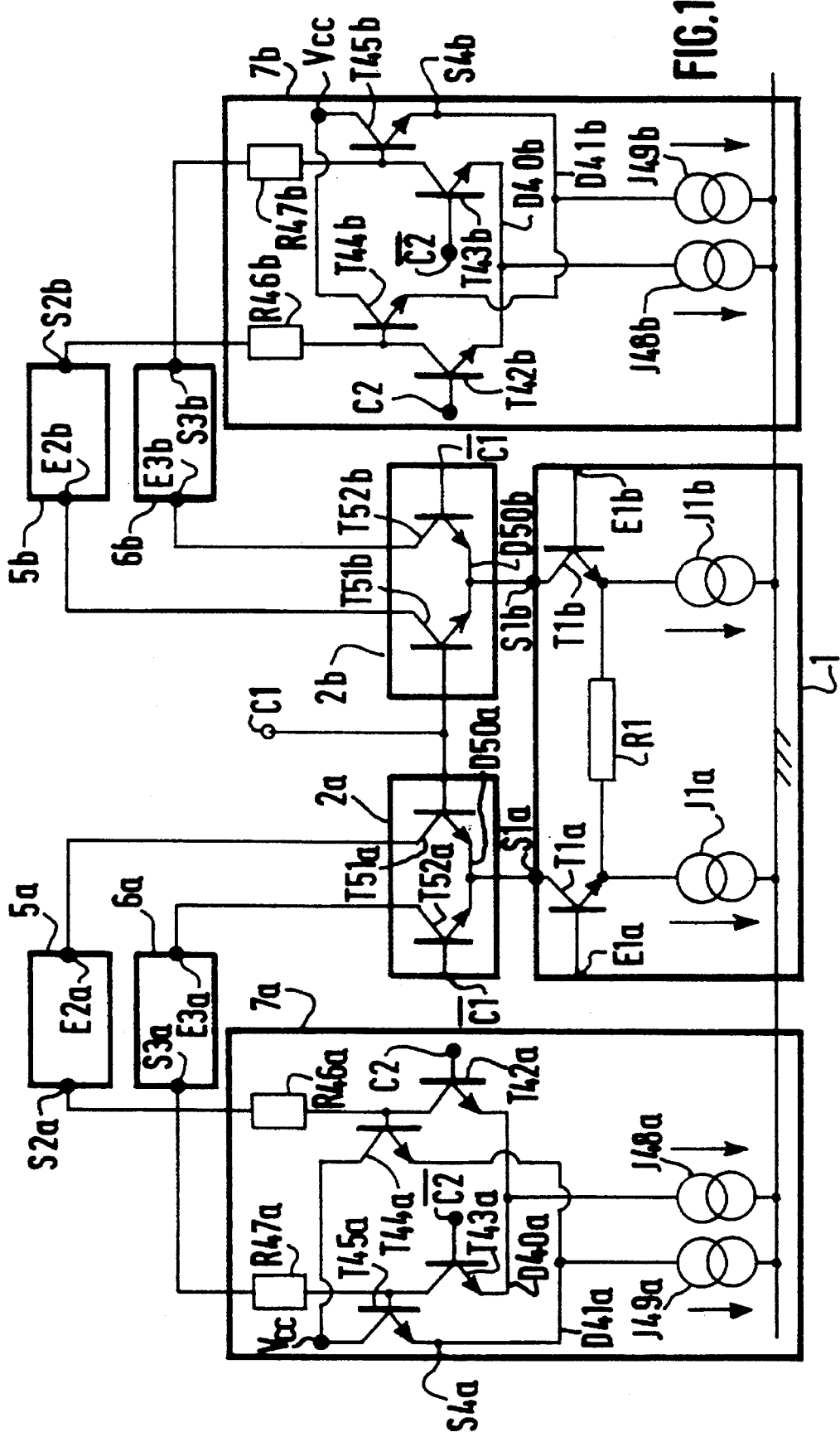
FIG. 1 is a basic diagram of an example of a sampler circuit according to the invention.

FIG. 1 represents a differential sampler circuit composed of a first and of a second part of like structure. The corresponding elements of these first and second parts bear the same references indexed with the letter a and b respectively.

In accordance with FIG. 1, a sampler circuit according to the invention includes two differential inputs E1$a$ and E1$b$ respectively receiving the input signal and its inverse, as well as two differential outputs S4$a$ and S4$b$ delivering two mutually inverse output signals. It also includes a voltage/current converter 1 whose two inputs E1$a$ and E1$b$ are those of the sampler circuit, and which has two outputs S1$a$ and S1$b$. To these outputs S1$a$ and S1$b$ are respectively linked the first and the second part of the differential sampler circuit. Thus, the output S1$a$ of the voltage/current converter is linked via an input multiplexer module 2$a$ to the inputs E2$a$ and E3$a$ of a first and of a second track-and-hold modules 5$a$ and 6$a$. The outputs S2$a$ and S3$a$ of these track-and-hold modules 5$a$ and 6$a$ are linked to an output S4$a$ of the sampler circuit via an output multiplexer module 7$a$. Similarly, the output S1$b$ of the voltage/current converter 1 is linked via an input multiplexer module 2$b$ to the inputs E2$b$ and E3$b$ of a first and of a second track-and-hold modules 5$b$ and 6$b$. The outputs S2$b$ and S3$b$ of these track-and-hold modules 5$b$ and 6$b$ are linked to the output S4$b$ of the sampler circuit via an output multiplexer module 7$b$.

The voltage/current converter 1 is composed of two transistors T1$a$ and T1$b$ whose bases constitute the inputs E1$a$ and E1$b$ of the sampler circuit, whose emitters are on the one hand connected together via a resistor R1, and on the other hand connected to earth via two current sources J1$a$ and J1$b$ respectively, and whose collectors respectively constitute the outputs S1$a$ and S1$b$ of the voltage/current converter.

The input multiplexer modules 2$a$ and 2$b$ each consist of a differential transistor pair D50$a$ and D50$b$ including two transistors T51$a$ and T52$a$ on the one hand, and T51$b$ and T52$b$ on the other hand. The emitters of the two transistors T51$a$ and T52$a$ are thus connected to the output S1$a$ of the voltage/current converter 1, whereas those of the transistors T51$b$ and T52$b$ are connected to the output S1$b$. The collectors of the transistors T51$a$ and T52$a$ are linked respectively to the inputs E2$a$ and E3$a$ of the track-and-hold modules 5$a$ and 6$a$, whereas those of the transistors T51$b$ and T52$b$ are linked to the inputs E2$b$ and E3$b$ of the track-and-hold modules 5$b$ and 6$b$. Finally, the bases of the transistors T51$a$ and T51$b$ receive a first clock signal C1, whereas those of the transistors T52$a$ and T52$b$ receive the inverse $\overline{C1}$ of this first clock signal.

The output multiplexer module 7$a$ consists of two differential pairs of transistors D40$a$ and D41$a$. The differential transistor pair D40$a$ is composed of two transistors T42$a$ and T43$a$ whose emitters are connected respectively to an earth via a current source J48$a$, whose bases receive a second clock signal C2 and its inverse $\overline{C2}$ respectively, and whose collectors, which are furthermore linked to the outputs S2$a$ and S3$a$ respectively of the track-and-hold modules 5$a$ and 6$a$ via two resistors R46$a$ and R47$a$, make it possible to control the differential transistor pair D41$a$. This differential transistor pair D41$a$ is in fact composed of two transistors T44$a$ and T45$a$ whose bases are linked to the collectors of the transistors T42$a$ and T43$a$. The emitters of the transistors T44$a$ and T45$a$ are connected on the one hand to earth via a current source J49$a$, and on the other hand to the output S4$a$ of the sampler circuit. Their collectors, finally, are connected to a supply voltage terminal Vcc.

Similarly, the output multiplexer module 7$b$ consists of two differential pairs of transistors D40$b$ and D41$b$. The differential transistor pair D40$b$ is composed of two transistors T42$b$ and T43$b$ whose emitters are connected respectively to an earth via a current source J48$b$, whose bases receive a second clock signal C2 and its inverse $\overline{C2}$ respectively, and whose collectors, which are furthermore linked to the outputs S2$b$ and S3$b$ respectively of the track-and-hold modules 5$b$ and 6$b$ via two resistors R46$b$ and R47$b$, make it possible to control the differential transistor pair D41$b$. This differential transistor pair D41$b$ is in fact composed of two transistors T44$b$ and T45$b$ whose bases are linked to the collectors of the transistors T42$b$ and T43$b$. The emitters of the transistors T44$b$ and T45$b$ are connected on the one hand to earth via a current source J49$a$, and on the other hand to the output S4$b$ of the sampler circuit. Their collectors, finally, are connected to the supply voltage terminal Vcc.

Figure 2:
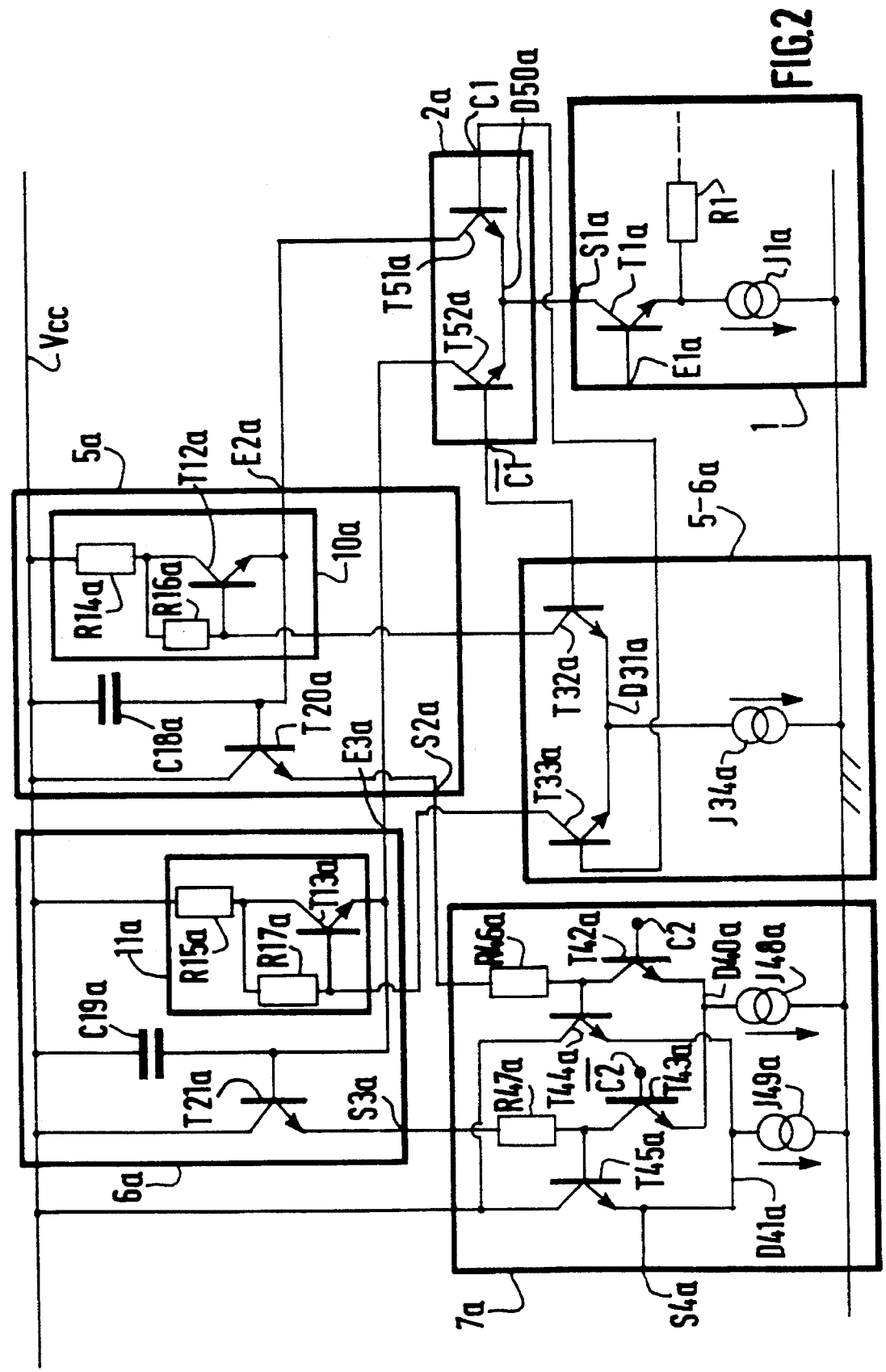
FIG. 2 is a diagram of a detailed example of a sampler circuit according to the invention.

FIG. 2 represents a detailed example of the first part of a differential sampler circuit according to the invention. The second part of such a circuit is readily derived therefrom.

In accordance with FIG. 2, each track-and-hold module 5$a$ (and 6$a$) includes an input load 10$a$ (and 11$a$) comprising a transistor T12$a$ (and T13$a$) whose collector is connected to the supply voltage terminal Vcc via a resistor R14$a$ (and R15$a$), whose base is connected to the collector via a resistor R16$a$ (and R17$a$) and whose emitter constitutes the input E2$a$ (and E3$a$) of the track-and-hold module 5$a$ (and 6$a$). It furthermore includes a capacitor C18$a$ (and C19$a$) linked between the supply voltage terminal Vcc and the input E2$a$ (and E3$a$) of the track-and-hold module 5$a$ (and 6$a$), as well as an output emitter-follower transistor T20$a$ (and T21$a$) whose base is linked to the said input E2$a$ (and E3$a$), whose collector is connected to the supply voltage terminal Vcc, and whose emitter constitutes the output S2$a$ (and S3$a$) of the track-and-hold module 5$a$ (and 6$a$). These track-and-hold modules 5$a$ and 6$a$ also include a switching cell 5-6$a$, common to both modules, including a differential transistor pair D31$a$ comprising two transistors T33$a$ and T32$a$, whose bases respectively receive the first clock signal C1 and its inverse $\overline{C1}$, whose emitters are connected to earth via a current source J34$a$, and whose collectors are connected respectively to the bases of the transistors T13$a$ and T12$a$ of the track-and-hold modules 6$a$ and 5$a$.

In the remainder of the description, it will be assumed that the levels of the first and second clock signals C1 and C2 are high, that is to say that the levels of their inverses $\overline{C1}$ and $\overline{C2}$ are low. The track-and-hold module 5$a$ therefore operates in track mode whereas the track-and-hold module 6$a$ operates in hold mode.

In fact, the switching cell 5-6$a$ makes it possible to forward-bias the transistor T12$a$ whereas the transistor T13$a$ is reverse-biased: the base of the transistor T32$a$ being low, transistor T33$a$ is the one which is conducting, engendering a collector current in the resistor R17$a$. The voltage drop at the terminals of this resistor is then large enough for the transistor T14a to be off. The capacitor C19a is then isolated from the input load 11a, and the track-and-hold module 6a is set into hold mode. By contrast, the current which flows through the resistor R16a is merely a base current, small enough for the transistor T12a to be conducting. Thus, the input signal is transformed into a current by the voltage/current converter 1, and this current flows through the load 10a of the track-and-hold module 5a and through the transistor T51a of the input multiplexer module 2a since the base of the latter is high, therefore making it possible to charge or discharge the capacitor C18a.

At the output, the base of the transistor T42a being high, a collector current is engendered in the resistor R46a, entailing a drop in potential on the base of the transistor T44a. Therefore transistor T45a is the one which is conducting, duplicating on the output S4a of the sampler circuit the voltage present at the terminals of the capacitor C19a.

Conversely, when the levels of the first and second clock signals C1 and C2 are low, the track-and-hold module 5a operates in hold mode whereas the track-and-hold module 6a operates in track mode.

Although the invention has been described in accordance with a concrete embodiment, it remains understood that variants easily conceived by those skilled in the art are possible, and that these variants lie within the field of the invention.

I claim:

1. Differential sampler circuit, comprising:
   a first and second input multiplexer modules;
   a first and second output multiplexer modules;
   two track and hold modules;
   two differential inputs;
   two outputs; and
   a voltage/current converter whose inputs are coupled to the differential inputs and which has two outputs,
   wherein one of the outputs of the voltage/current converter is linked via the first input multiplexer module and controlled by a first clock signal, to the inputs of the first and second track-and-hold modules whose outputs are linked to one of the outputs of the sampler circuit via the first output multiplexer module controlled by a second clock signal, in such a way that:
   for a first level of the first and second clock signals, the first track-and-hold module operates in track mode whereas the second track-and-hold module operates in hold mode,
   for a second level of the first and second clock signals, the first track-and-hold module operates in hold mode whereas the second track-and-hold module operates in track mode,
   and in that the other output of the voltage/current converter is coupled to the other output of the sampler circuit via the second input multiplexer module, via two track-and-hold modules and via the second output multiplexer module which are configured correspondingly and controlled by the same clock signals.

2. Sampler circuit according to claim 1, wherein the first and second track-and-hold modules each include:
   an input load comprising a first transistor whose collector is connected to a supply voltage terminal via a first resistor, whose base is connected to the collector via a second resistor and whose emitter constitutes the input of the track-and-hold module,
   a capacitor connected by a first terminal to the supply voltage terminal and by a second terminal to the input of the track-and-hold module,
   an output stage including at least one second emitter-follower transistor whose base is linked to the second terminal of the capacitor, and in that they also include a switching cell, common to both track-and-hold modules, comprising a first differential transistor pair which is controlled by the first clock signal, and which includes a third and a fourth transistors connected respectively by their collector to the bases of the first transistors of the first and of the second track-and-hold modules, in such a way that:
   when the first clock signal is at its first level, the fourth transistor of the first differential transistor pair is the one which is active,
   and that when the first clock signal is at its second level, the third transistor of the first differential transistor pair is the one which is active.

3. Sampler circuit according to claim 2, wherein each of the output multiplexer modules comprises a second differential transistor pair, controlled by the second clock signal, and which itself makes it possible to control a third differential transistor pair, the transistors of the second and third pairs being linked by a collector-base link, the emitters of the transistors of the third pair constituting the output of the sampler circuit, their collectors being linked to the supply voltage terminal, and their bases being connected respectively to the emitters of the second transistors of the first and second track-and-hold modules via a third and a fourth resistor.

4. Sampler circuit according to claim 3, wherein each of the input multiplexer modules comprises a fourth differential transistor pair controlled by the first clock signal and whose transistors are connected respectively by their collector to the inputs of the first and second track-and-hold modules.

5. Sampler circuit according to claim 2, wherein each of the input multiplexer modules comprises a fourth differential transistor pair controlled by the first clock signal and whose transistors are connected respectively by their collector to the inputs of the first and second track-and-hold modules.

6. Sampler circuit according to claim 1, wherein each of the output multiplexer modules comprises a second differential transistor pair, controlled by the second clock signal, and which itself makes it possible to control a third differential transistor pair, the transistors of the second and third pairs being linked by a collector-base link, the emitters of the transistors of the third pair constituting the output of the sampler circuit, their collectors being linked to the supply voltage terminal, and their bases being connected respectively to the emitters of the second transistors of the first and second track-and-hold modules via a third and a fourth resistor.

7. Sampler circuit according to claim 6, wherein each of the input multiplexer modules comprises a fourth differential transistor pair controlled by the first clock signal and whose transistors are connected respectively by their collector to the inputs of the first and second track-and-hold modules.

8. Sampler circuit according to claim 1 wherein each of the input multiplexer modules comprises a fourth differential transistor pair controlled by the first clock signal and whose transistors are connected respectively by their collector to the inputs of the first and second track-and-hold modules.

9. A differential sampler circuit, comprising:
   an input for receiving a signal;
   an input multiplexing device for receiving the signal and for providing a first and a second multiplexed signal under control of a clock signal;
   a first track-and-hold module for receiving the first multiplexed signal;

a second track-and-hold module for receiving the second multiplexed signal;

an output stage for receiving outputs from the first and second track-and-hold modules;

wherein for a first level of the clock signal, the first track-and-hold module operates in track mode whereas the second track-and-hold module operates in hold mode, and for a second level of the clock signal, the first track-and-hold module operates in the hold mode whereas the second track-and-hold module operates in track mode.

10. The sampler circuit as claimed in claim 9, further including:

a second input for receiving a second signal such that the first and the second signal make up a differential signal;

a second input multiplexing device for receiving the second signal and for providing a third and a fourth multiplexed signal under control of the clock signal;

a third track-and-hold module for receiving the third multiplexed signal;

a fourth track-and-hold module for receiving the fourth multiplexed signal;

a second output stage for receiving outputs from the third and fourth track-and-hold modules; wherein for a first level of the clock signal, the third track-and-hold module operates in track mode whereas the fourth track-and-hold module operates in hold mode, and for a second level of the clock signal, the third track-and-hold module operates in hold mode whereas the fourth track-and-hold module operates in track mode.

11. Sampler circuit according to claim 9, wherein the first and second track-and-hold modules each include:

an input load comprising a first transistor whose collector is connected to a supply voltage terminal via a first resistor, whose base is connected to the collector via a second resistor and whose emitter constitutes the input of the track-and-hold module, a capacitor connected by a first terminal to the supply voltage terminal and by a second terminal to the input of the track-and-hold module, an output stage including at least one second emitter-follower transistor whose base is linked to the second terminal of the capacitor, and in that they also include a switching cell, common to both track-and-hold modules, comprising a first differential transistor pair which is controlled by the clock signal, and which includes a third and a fourth transistor connected respectively by their collector to the bases of the first transistors of the first and of the second track-and-hold modules, in such a way that:

when the clock signal is at its first level, the fourth transistor of the first differential transistor pair is the one which is active, and that when the clock signal is at its second level, the third transistor of the first differential transistor pair is the one which is active.

12. Sampler circuit according to claim 11, wherein each of the output stages comprises a second differential transistor pair, controlled by a second clock signal, and which itself makes it possible to control a third differential transistor pair, the transistors of the second and third pairs being linked by a collector-base link, the emitters of the transistors of the third pair constituting the output of the sampler circuit, their collectors being linked to the supply voltage terminal, and their bases being connected respectively to the emitters of the second transistors of the first and second track-and-hold modules via a third and a fourth resistor.

13. Sampler circuit according to claim 12 wherein each of the input multiplexer modules comprises a fourth differential transistor pair controlled by the clock signal and whose transistors are connected respectively by their collector to the inputs of the first and second track-and-hold modules.

\* \* \* \* \*